US010218371B1

(12) United States Patent
Zhuang et al.

(10) Patent No.: US 10,218,371 B1
(45) Date of Patent: Feb. 26, 2019

(54) COST EFFECTIVE DAC LINEARIZATION SYSTEM

(71) Applicant: Iowa State University Research Foundation, Inc., Ames, IA (US)

(72) Inventors: Yuming Zhuang, Ames, IA (US); Degang James Chen, Ames, IA (US); Benjamin Magstadt, Lincoln, NE (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 15/909,233

(22) Filed: Mar. 1, 2018

(51) Int. Cl.
| | | |
|---|---|---|
| *H03M 1/10* | (2006.01) |
| *H03M 1/06* | (2006.01) |
| *H03M 1/56* | (2006.01) |
| *H03M 1/66* | (2006.01) |

(52) U.S. Cl.
CPC ....... *H03M 1/1023* (2013.01); *H03M 1/0607* (2013.01); *H03M 1/56* (2013.01); *H03M 1/66* (2013.01)

(58) Field of Classification Search
CPC combination set(s) only.
See application file for complete search history.

(56) References Cited

U.S. PATENT DOCUMENTS

| | | | |
|---|---|---|---|
| 6,124,813 | A | 9/2000 | Robertson et al. |
| 6,392,578 | B1 | 5/2002 | Russell |
| 6,489,911 | B1 | 12/2002 | O'Dwyer |
| 8,885,763 | B2 | 11/2014 | Ananthaswamy |
| 2005/0157819 | A1* | 7/2005 | Wang ............... H04L 27/364 375/322 |
| 2009/0098839 | A1* | 4/2009 | Hara ............... H03C 1/62 455/102 |
| 2011/0109487 | A1* | 5/2011 | Agi ............... H03M 1/1052 341/120 |
| 2017/0187401 | A1 | 6/2017 | Talty et al. |

FOREIGN PATENT DOCUMENTS

EP     0430449 A2     6/1991

OTHER PUBLICATIONS

Abe, F., et al., "Low-Distortion Signal Generation for ADC Testing," Proceedings of the 2014 International Test Conference, Oct. 20-23, 2014, Seattle, Washington, USA, 10 pages.

(Continued)

*Primary Examiner* — Peguy Jean Pierre
(74) *Attorney, Agent, or Firm* — Withrow & Terranova, P.L.L.C.

(57) ABSTRACT

The present disclosure relates to a digital-to-analog converter (DAC) linearization system including a DAC, a summing buffer structure, an analog-to-digital converter (ADC), a calculation system, an error look-up table, and an adder. A combination of the DAC, the summing buffer structure, and the ADC sequentially provide first and second ADC output signals, both of which include DAC integral nonlinearity (INL). The calculation system calculates the DAC INL based on the first and second ADC output signals, the error look-up table provides a correction signal mapping to the calculated DAC INL, and the adder provides a calibrated digital input signal to the DAC based on the correction signal. The calibrated digital input signal ensures the DAC to generate an updated output signal with less nonlinearity and improved purity.

24 Claims, 2 Drawing Sheets

(56) References Cited

OTHER PUBLICATIONS

Carley, L. R., "A noise-shaping coder topology for 15+ bit converters," IEEE Journal of Solid-State Circuits, vol. 24, Issue 2, Apr. 1989, pp. 267-273.
Fattaruso, J., et al., "Self-calibration techniques for a second-order multibit sigma-delta modulator," IEEE Journal of Solid-State Circuits, vol. 28, Issue 12, Dec. 1993, pp. 1216-1223.
Gupta, A., et al., "Second order Dynamic element matching technique for low Oversampling Delta Sigma ADC," Proceedings of the 2006 IEEE International Symposium on Circuits and Systems, May 21-24, 2006, Island of Kos, Greece, pp. 2973-2976.
Hsieh, H.-Y., et al., "A first-order tree-structured DAC with reduced signal-band noise," IEEE Transactions on Circuits and Systems II: Express Briefs, vol. 54, Issue 5, May 2007, pp. 392-396.
Manoli, Y., "A self-calibration method for fast high-resolution A/D and D/A converters," IEEE Journal of Solid-State Circuits, vol. 24, Issue 3, Jun. 1989, pp. 603-608.
Netterstrom, A., "Using digital pre-distortion to compensate for analog signal processing errors," IEEE International Conference on Radar, May 7-10, 1990, Arlington, Virginia, USA, pp. 243-248.
Petrie, C., et al., "A background calibration technique for multibit delta-sigma modulators," Proceedings of the 2000 IEEE International Symposium on Circuits and Systems: Emerging Technologies for the 21st Century, May 28-31, 2000, Geneva, Switzerland, 4 pages.
Wang, H. W., et al., "High speed CMOS digital-to-analog converter with linear interpolator," IEEE Transactions on Consumer Electronics, vol. 46, Issue 4, Nov. 2000, pp. 1137-1142.
Wang, X., et al., "Digital correlation technique for the estimation and correction of DAC errors in multibit mash $\Delta\Sigma$ ADCs," Proceedings of the 2002 IEEE International Symposium on Circuits and Systems, May 26-29, 2002, Phoenix-Scottsdale, Arizona, USA, 4 pages.
Witte, P., et al., "A background DAC error estimation in Sigma-Delta ADCs using a pseudo random noise based correlation technique," Proceedings of the 2009 IEEE International Symposium on Circuits and Systems, May 24-27, 2009, Taipei, Taiwan, pp. 1549-1552.
Zhuang, Y., et al., "High-Purity Sine Wave Generation Using Nonlinear DAC with Predistortion Based on Low-Cost Accurate DAC-ADC Co-Testing," IEEE Transactions on Instrumentation and Measurement, vol. 67, Issue 2, Feb. 2018, pp. 279-287.

* cited by examiner

COST EFFECTIVE DAC LINEARIZATION SYSTEM

FIELD OF THE DISCLOSURE

The present disclosure relates to a cost effective DAC linearization system.

BACKGROUND

Data converters play a crucial rule in the electronics field as they bridge the analog world to the digital domain and vice versa in modern integrated circuits (ICs). Over the last decades, significant progress has been achieved in designing high resolution analog-to-digital converters (ADCs) and digital-to-analog converters (DACs). In order to characterize such sophisticated data converters, especially ADCs, spectral testing is now widely utilized. The spectral testing normally requires an analog input signal to the tested ADC having 3 to 4 bits more purity than the tested ADC itself. If the analog input signal does not meet the high purity requirement, the ADC output spectrum will no longer contain just ADC nonlinearity, but will also contain nonlinearity from the analog input signal. The ADC's specifications, such as total harmonic distortion (THD) and spurious free dynamic range (SFDR), cannot be accurately obtained from the output spectrum.

In some applications, the analog input signal for the tested ADC may be generated by a high purity DAC with superior linearization. However, when the resolution of the tested ADC is high, for instance a 16-bit, it is very challenging (sophisticated circuitry design, and or complicated calibration) and costly to design a high purity DAC with superior linearization to achieve a pure enough analog input signal.

Accordingly, there remains a need for an improved DAC linearization system that provides ultra-pure sinusoidal/cosinusoidal signals with an easy implementation at a low cost.

SUMMARY

The present disclosure relates to a cost effective digital-to-analog converter (DAC) linearization system. The disclosed DAC linearization system includes a DAC, a summing buffer structure, an analog-to-digital converter (ADC), a calculation system, an error look-up table, and an adder. The DAC is configured to sequentially provide a first DAC output signal and a second DAC output signal based on a digital input signal. Both the first DAC output signal and the second DAC output signal include DAC integral nonlinearity (INL) from the DAC. The summing buffer structure is configured to sequentially provide a first summing output signal and a second summing output signal. Herein, the first summing output signal is based on the first DAC output signal and a first offset signal, and the second summing output signal is based on the second DAC output signal and a second offset signal. The first offset signal is different from the second offset signal. The ADC is configured to sequentially provide a first ADC output signal based on the first summing output signal and a second ADC output signal based on the second summing output signal. The calculation system is configured to calculate the DAC INL based on the first ADC output signal and the second ADC output signal. The error look-up table is configured to provide a correction signal mapping to the calculated DAC INL and the adder is configured to provide a calibrated digital input signal to the DAC by calibrating the digital input signal with the correction signal. The calibrated digital input signal ensures the DAC to generate an updated output signal that includes less DAC INL than the first DAC output signal and the second DAC output signal.

In one embodiment of the DAC linearization system, the calculation system includes at least one of a group of a microcontroller, application specific integrated circuit (ASIC), and a computer.

In one embodiment of the DAC linearization system, the error look-up table and the calculation system are embedded in a same printed circuit board (PCB) as the DAC and the ADC.

In one embodiment of the DAC linearization system, the error look-up table and the calculation system are integrated in a same microcontroller, which is embedded in the same PCB as the DAC and the ADC.

In one embodiment of the DAC linearization system, the DAC, the summing buffer structure, the ADC, the calculation system, the error look-up table, and the adder are integrated in a chip.

In one embodiment of the DAC linearization system, the error look-up table and the calculation system are off a PCB board, in which the DAC and the ADC are embedded.

In one embodiment of the DAC linearization system, the error look-up table and the calculation system are implemented in a same computer.

In one embodiment of the DAC linearization system, the first DAC output signal and the second DAC output signal are identical.

In one embodiment of the DAC linearization system, the first offset signal is zero and the second offset signal has an offset voltage which is 0.5%-1% output range of the first DAC output signal.

According to another embodiment, the DAC linearization system further includes an offset generator configured to provide either the first offset signal or the second offset signal to the summing buffer structure.

In one embodiment of the DAC linearization system, the calculation system is configured to provide a control signal to the offset generator to selectively provide the first offset signal and the second offset signal to the summing buffer structure.

In one embodiment of the DAC linearization system, the offset generator includes a three-terminal switch having a first switch terminal coupled to the summing buffer structure, a second switch terminal coupled to ground, and a third switch terminal coupled to an offset supply. Herein, when the first switch terminal is coupled to the second switch terminal, the offset generator provides the first offset signal to the summing buffer structure. When the first switch terminal is coupled to the third switch terminal, the offset generator provides the second offset signal to the summing buffer structure.

In one embodiment of the DAC linearization system, the calculation system is configured to provide a control signal to the offset generator to selectively connect the first switch terminal with the second switch terminal and the first switch terminal with the third switch terminal.

In one embodiment of the DAC linearization system, the summing buffer structure comprises a summing unit and an operational amplifier (op-amp) buffer coupled to the summing unit. Herein, the summing unit is configured to sum the first DAC output signal and the first offset signal and the op-amp buffer is configured to provide the first summing output signal. Alternatively, the summing unit is configured to sum the second DAC output signal and the second offset signal and the op-amp buffer is configured to provide the second summing output signal.

In one embodiment of the DAC linearization system, the DAC and the ADC have a same resolution.

In one embodiment of the DAC linearization system, the DAC has a lower resolution than the ADC.

In one embodiment of the DAC linearization system, the DAC has a higher resolution than the ADC.

According to an exemplary operation process for generating an analog signal with superior linearity, a first DAC output signal and a second DAC output signal are sequentially generated by a DAC based on a digital input signal. Both the first DAC output signal and the second DAC output signal include DAC INL from the DAC. A first summing output signal and a second summing output signal are then sequentially generated by a summing buffer structure. Herein, the first summing output signal is generated based on the first DAC output signal and a first offset signal. The second summing output signal is generated based on the second DAC output signal and a second offset signal. The first offset signal is different from the second offset signal. Next, a first ADC output signal and a second ADC output signal are sequentially generated by an ADC. The first ADC output signal is generated based on the first summing output signal, and the second ADC output signal is generated based on the second summing output signal. After the first ADC output signal and the second ADC output signal are generated, the DAC INL from the DAC is calculated by a calculation system based on the first ADC output signal and the second ADC output signal. A correction signal mapping to the calculated DAC INL is then provided by an error look-up table. Finally, the digital input signal is calibrated with the correction signal to provide a calibrated digital input signal to the DAC.

According to another embodiment, the exemplary operation process further includes generating an updated DAC output signal by the DAC based on the calibrated digital input signal. Herein, the updated DAC output signal corrects at least a portion of the DAC INL included in the DAC and has higher purity level than the first DAC output signal and the second DAC output signal.

According to another embodiment, the exemplary operation process further includes selectively providing the first offset signal and the second offset signal to the summing buffer structure by an offset generator.

In one embodiment of the exemplary operation process, selectively providing the first offset signal and the second offset signal to the summing buffer structure is controlled by a control signal generated by the calculation system to the offset generator.

According to another embodiment, the exemplary operation process further includes storing the digital input signal, the first ADC output signal, and the second ADC output signal in the calculation system before calculating the DAC INL from the DAC.

In one embodiment of the exemplary operation process, calculating the DAC INL is implemented by a first portion of the calculation system, which is a microcontroller embedded in a same PCB as the DAC and the ADC.

In one embodiment of the exemplary operation process, calculating the DAC INL is implemented by a first portion of the control system, which is a computer off a PCB that the DAC and the ADC are embedded in.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1-2 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
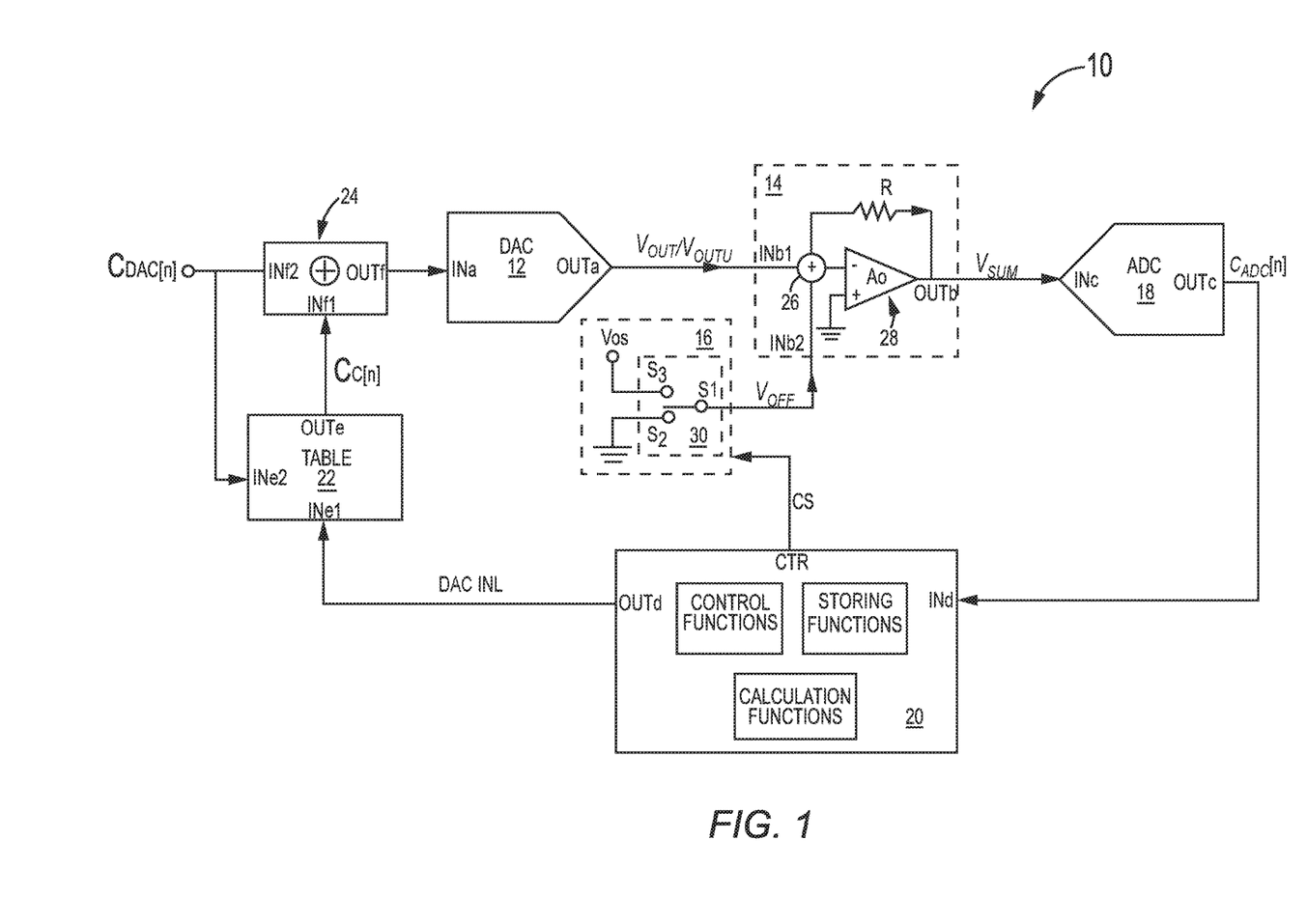
FIG. 1 shows an exemplary digital-to-analog converter (DAC) linearization system according to one embodiment of the present disclosure.
Figure 2:
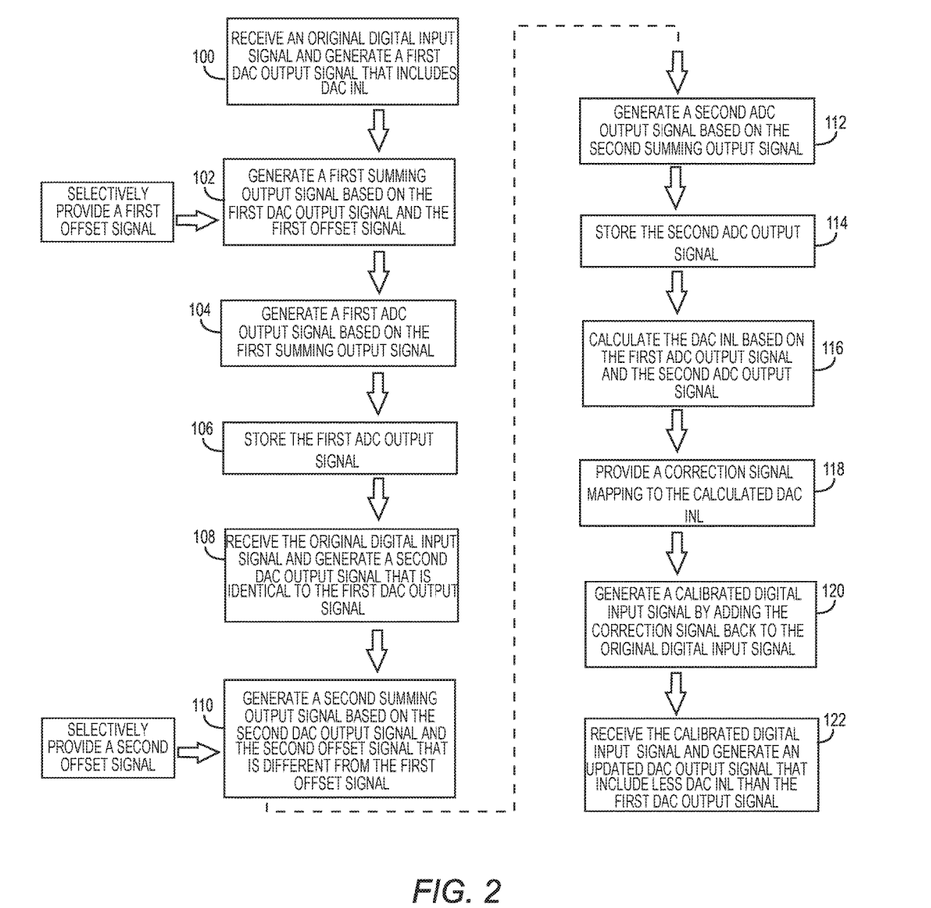
FIG. 2 provides a flow diagram that illustrates an exemplary operation process to generate an analog signal with superior linearity by the DAC linearization system illustrated in FIG. 1.

The present disclosure relates to a cost effective digital-to-analog converter (DAC) linearization system. FIG. 1 shows an exemplary DAC linearization system 10 according to one embodiment of the present disclosure and FIG. 2 provides a flow diagram that illustrates an exemplary operation process to generate an analog signal with superior linearity by the DAC linearization system 10 illustrated in FIG. 1. The DAC linearization system 10 includes a DAC 12, a summing buffer structure 14, an offset generator 16, an analog-to-digital converter (ADC) 18, a calculation system 20, an error look-up table 22, and an adder 24. In different applications, the DAC 12 and the ADC 18 may have a same resolution or different resolutions. In one embodiment, the DAC 12 has a lower resolution than the ADC 18. In another embodiment, the DAC 12 has a higher resolution than the ADC 18.

Herein, the DAC 12 has an input terminal INa and an output terminal OUTa; the summing buffer structure 14 has a first input terminal INb1, a second input terminal INb2, and an output terminal OUTb; the ADC 18 has an input terminal INc and an output terminal OUTc; the calculation system 20 has an input terminal INd, an output terminal OUTd, and a control terminal CTR; the error look-up table 22 has a first input terminal INe1, a second input signal INe2, and an output terminal OUTe; and the adder 24 has a first input terminal INf1, a second input terminal INf2, and an output terminal OUTf.

The first input terminal INb1 of the summing buffer structure 14 is coupled to the output terminal OUTa of the DAC 12, the second input terminal INb2 of the summing buffer structure 14 is coupled to the offset generator 16, and the output terminal OUTb of the summing buffer structure 14 is coupled to the input terminal INc of the ADC 18. In one embodiment, the summing buffer structure 14 may include a summing unit 26 and an operational amplifier (op-amp) buffer 28 coupled to the summing unit 26. The summing unit 26 is coupled to the output terminal OUTa of the DAC 12 and the offset generator 16, while the op-amp buffer 28 is coupled to the input terminal INc of the ADC 18. The offset generator 16 may include a three-terminal switch 30 having a first switch terminal S1, a second switch terminal S2, and a third switch terminal S3. The first switch terminal S1 is coupled to the second input terminal INb2 of the summing buffer structure 14, the second switch terminal S2 is coupled to ground, and the third switch terminal S3 is coupled to an offset supply $V_{OS}$. The first switch terminal S1 is selectively coupled to the second switch terminal S2 and the third switch terminal S3 based on a control signal CS provided from the control terminal CTR of the calculation system 20. In addition, the input terminal INd of the calculation system 20 is coupled to the output terminal OUTc of the ADC 18 and the output terminal OUTd of the calculation system 20 is coupled to the first input terminal INe1 of the error look-up table 22. The second input terminal INe2 of the error look-up table 22 is configured to receive an original digital input signal $C_{DAC}[n]$ and the output terminal OUTe of the error look-up table 22 is coupled to the first input terminal INf1 of the adder 24. The second input terminal INe2 of the adder 24 is configured to receive the original digital input signal $C_{DAC}[n]$, and the output terminal OUTf of the adder 24 is coupled to the input terminal INa of the DAC 12.

The DAC 12 is configured to receive the original digital input signal $C_{DAC}[n]$ and provide a original DAC output signal $V_{OUT}(n)$ that includes DAC integral nonlinearity (INL) $INL_{DAC}[C_{DAC}[n]]$ from the DAC 12 ($V_{OUT}(n)=C_{DAC}[n]+INL_{DAC}[C_{DAC}[n]]$). At least a portion of the DAC INL may be corrected by calibrating the original digital input signal $C_{DAC}[n]$ to the DAC 12. The original digital input signal $C_{DAC}[n]$ is calibrated by a correction signal $C_C[n]$ generated from a feedback loop including the summing buffer structure 14, the offset generator 16, the ADC 18, the calculation system 20, and the error look-up table 22. Herein, the correction signal $C_C[n]$ is mapping to the DAC INL from the DAC 12. The adder 24 sums the original digital input signal $C_{DAC}[n]$ and the correction signal $C_C[n]$ to provide a calibrated digital input signal to the DAC 12. As such, an updated DAC output signal $V_{OUTU}(n)$ based on the calibrated digital input signal corrects at least a portion of the DAC INL included in the DAC 12 and has a higher purity level than the original DAC output signal $V_{OUT}(n)$. In one embodiment, at least 99% DAC INL from DAC 12 is cancelled out in the updated DAC output signal $V_{OUTU}(n)$. Herein, the updated DAC output signal $V_{OUTU}(n)$ is the output of the DAC linearization system 10.

For a first preparing flow route (steps 100-106), the error look-up table 22 is turned off, and the adder 24 only receives the original digital input signal $C_{DAC}[n]$ at the second input terminal INf2 of the adder 24. Consequently, the DAC 12 receives the original digital input signal $C_{DAC}[n]$ at the input terminal INa of the main DAC 12 through the adder 24, and generates a first DAC output signal $V_{out(1)}(n)$ at the output terminal OUTa of the DAC 12 (step 100). The original digital input signal $C_{DAC}[n]$ may be an ideal digital sinusoidal/cosinusoidal signal with essentially no noise or distortion. The first DAC output signal $V_{out(1)}(n)$, however, includes DAC INL $INL_{DAC}[C_{DAC}[n]]$ from the DAC 12. The first DAC output signal $V_{out(1)}(n)$ may be represented as $C_{DAC}[n]+INL_{DAC}[C_{DAC}[n]]$.

The summing buffer structure 14 then provides a first summing output signal $V_{SUM(1)}(n)$ based on the first DAC output signal $V_{OUT(1)}(n)$ and a first offset signal $V_{OFF(1)}$ from the offset generator 16 (step 102). Herein, the first offset signal $V_{OFF(1)}$ is selectively provided based on a control signal CS from the calculation system 20 to the offset generator 16. In one embodiment, the offset generator 16 includes the three-terminal switch 30 having the first switch terminal S1 coupled to the summing buffer structure 14, the second switch terminal S2 coupled to ground, and the third switch terminal S3 coupled to the offset supply $V_{OS}$. When the first switch terminal S1 is selectively coupled to the second switch terminal S2 based on the control signal CS from the calculation system 20, the offset generator 16 provides the first offset signal $V_{OFF(1)}$ to the summing buffer structure 14. Herein, the first offset signal $V_{OFF(1)}$ is equal to zero.

In addition, the summing buffer structure 14 may include the summing unit 26 and the op-amp buffer 28 coupled to the summing unit 26. The summing unit 26 sums the first DAC output signal $V_{OUT(1)}(n)$ and the first offset signal $V_{OFF(1)}$. The op-amp buffer 28 provides a gain G to the summation of the first DAC output signal $V_{OUT(1)}(n)$ and the first offset signal $V_{OFF(1)}$. As such, the first summing output signal $V_{SUM(1)}(n)$ is equal to $[C_{DAC}[n]+INL_{DAC}[C_{DAC}[n]]] \cdot G$.

Next, the ADC 18 receives the first summing output signal $V_{SUM(1)}(n)$ and provides a first ADC output signal $C_{ADC(1)}[n]$ based on the summing output signal $V_{SUM(1)}(n)$ (step 104). Herein, the ADC 18 includes ADC INL $INL_{ADC}[C_{ADC(1)}[n]]$, such that the first summing output signal $V_{SUM(1)}(n)$ (an input signal to the ADC 18) may also be expressed as $C_{ADC(1)}[n]+INL_{ADC}[C_{ADC(1)}[n]]$. At the end of the first preparing flow route, the first ADC output signal $C_{ADC(2)}[n]$ is stored in the calculation system 20 (step 106).

For a second preparing flow route (steps 108-114), the error look-up table 22 is still turned off, and the adder 24 only receives the original digital input signal $C_{DAC}[n]$ at the second input terminal INf2 of the adder 24. Consequently, the DAC 12 receives the original digital input signal $C_{DAC}[n]$ at the input terminal INa of the DAC 12 through the adder 24, and generates a second DAC output signal $V_{OUT(2)}(n)$ at the output terminal OUTa of the DAC 12 (step 108). The second DAC output signal $V_{OUT(2)}(n)$ also includes the DAC INL $INL_{DAC}[C_{DAC}[n]]$ from the DAC 12. The second DAC output signal $V_{OUT(2)}(n)$ may also be represented as $C_{DAC}[n]+INL_{DAC}[C_{DAC}[n]]$ and substantially the same as the first DAC output signal $V_{OUT(1)}(n)$.

The summing buffer structure 14 then provides a second summing output signal $V_{SUM(2)}(n)$ based on the second DAC output signal $V_{OUT(2)}(n)$ and a second offset signal $V_{OFF(2)}$ from the offset generator 16 (step 110). Herein, the second offset signal $V_{OFF(2)}$ is selectively provided based on the control signal CS from the calculation system 20 to the offset generator 16. The second offset signal $V_{OFF(2)}$ is different from the first offset signal $V_{OFF(1)}$. In one embodiment, the offset generator 16 includes the three-terminal switch 30 having the first switch terminal S1 coupled to the summing buffer structure 14, the second switch terminal S2 coupled to ground, and the third switch terminal S3 coupled to the offset supply $V_{OS}$. When the first switch terminal S1 is selectively coupled to the third switch terminal S3 based on the control signal CS from the calculation system 20, the offset generator 16 provides the second offset signal $V_{OFF(2)}$ to the summing buffer structure 14. Herein, the second offset signal $V_{OFF(2)}$ is equal to the offset supply $V_{OS}$ with an offset voltage which is 0.5%-1% output range of the first DAC output signal.

In addition, the summing buffer structure 14 may include the summing unit 26 and the op-amp buffer 28 coupled to the summing unit 26. The summing unit 26 sums the second DAC output signal $V_{OUT(2)}(n)$ and the second offset signal $V_{OFF(2)}$. The op-amp buffer 28 provides the gain G to the summation of the second DAC output signal $V_{OUT(2)}(n)$ and the second offset signal $V_{OFF(2)}$. As such, the second summing output signal $V_{SUM(2)}(n)$ is equal to $[C_{DAC}[n]+INL_{DAC}[C_{DAC}[n]]] \cdot G+V_{OS}$.

Next, the ADC 18 receives the second summing output signal $V_{SUM(2)}(n)$ and provides a second ADC output signal $C_{ADC(2)}[n]$ based on the second summing output signal $V_{SUM(2)}(n)$ (step 112). Herein, the ADC 18 includes ADC INL $INL_{ADC}[C_{ADC(2)}[n]]$, such that second summing output signal $V_{SUM(2)}(n)$ (an input signal to the ADC 18) may also be expressed as $C_{ADC(2)}[n]+INL_{ADC}[C_{ADC(2)}[n]]$. At the end of the second preparing flow route, the second ADC output signal $C_{ADC(2)}[n]$ is stored in the calculation system 20 (step 114).

After the first ADC output signal $C_{ADC(1)}[n]$ and the second ADC output signal $C_{ADC(2)}[n]$ are acquired, the DAC INL from the DAC 12 and the ADC INL from the ADC 18 are calculated by the calculation system 20 (step 116). Besides the storing functions, the calculation system 22 is also configured to implement control functions and calculation functions. For the control functions, the calculation system 20 is configured to generate the control signal CS to the offset generator 16 to selectively provide the first offset signal $V_{OFF(1)}$ (couple the first switch terminal S1 to the second switch terminal S2) and the second offset signal $V_{OFF(2)}$ (couple the first switch terminal S1 to the third switch terminal S3) to the summing buffer structure 14. In addition, the calculation system 20 may be configured to turn off the error look-up table 22 at the first and second preparing flow routes, such that the DAC 12 only receives the original digital input signal $C_{DAC}[n]$ through the adder 24. The calculation system 20 may be also configured to turn on the error look-up table 22 after the first and second preparing flow routes, such that the correction signal $C_C[n]$ from the error look-up table 22 is allowed to feed back to the adder 24 to calibrate the original digital input signal $C_{DAC}[n]$. For the calculation functions, the calculation system 22 is configured to calculate the DAC INL from the DAC 12 and the ADC INL from the ADC 18 based on the first ADC output signal $C_{ADC(1)}[n]$ and the second ADC output signal $C_{ADC(2)}[n]$. There may be different methods implemented in the calculation system 20 to calculate the DAC INL from the DAC 12 and the ADC INL from the ADC 18. See mathematic details in Sections A and B below.

The calculation system 20 may include at least one computing device providing firmware, hardware, and/or executable software (such as C++, Matlab, etc.), such as a microcontroller, application specific integrated circuit (ASIC), a personal computer, a computation engine, and the like. In one embodiment, the calculation system 20 is a microcontroller, which implements the storing functions, the control functions, and the calculation functions, and is embedded in a same printed circuit board (PCB) or overall system as the DAC 12 and the ADC 18. In one embodiment, the calculation system 20 is a computer, which implements the storing functions, the control functions, and the calculation functions, and is off the PCB board, where the DAC 12 and the ADC 18 are embedded. Further, in another embodiment, a first portion of the calculation system 20, which is configured to implement the control functions, may be a microcontroller, an ASIC, or a central processing unit (CPU). The first portion of the calculation system 20 is embedded in the same PCB board as the DAC 12 and the ADC 18. A second portion of the calculation system 20, which is configured to implement the storing functions and the calculation functions, may be a computer and is off the PCB board, where the DAC 12 and the ADC 18 are embedded.

Next, a correction signal $C_C[n]$ is provided by the error look-up table 22 based on the original digital input signal $C_{DAC}[n]$ and the calculated DAC INL $INL_{DAC}[C_{DAC}[n]]$ (Step 118). The correction signal $C_C[n]$ is mapping to the calculated DAC INL. In one embodiment, the error look-up table 22 and the calculation system 20 are integrated in a same microcontroller, which is embedded in a same PCB or overall system as the DAC 12 and the ADC 18. In one embodiment, the error look-up table 22 and the calculation system 20 are implemented in a computer off the board, where the DAC 12 and the ADC 18 are embedded. In one embodiment, the whole DAC linearization system 10 is implemented in chip.

The original digital input signal $C_{DAC}[n]$ is then calibrated at the adder 24 by adding the correction signal $C_C[n]$ to generate a calibrated digital input signal (Step 120). At last, the DAC 12 is configured to receive the calibrated digital input signal and provide the updated DAC output signal $V_{OUTU}(n)$ based on the calibrated digital input signal. The updated DAC output signal $V_{OUTU}(n)$ corrects at least a portion of the DAC INL included in the DAC and has higher purity level than the first DAC output signal and the second DAC output signal. In one embodiment, at least 99% DAC INL from DAC 12 is cancelled out in the updated DAC output signal $V_{OUTU}(n)$.

It is clear to those skilled in the art that even if the DAC 12 and the ADC 18 are not ideal and have unneglectable nonlinearities, the DAC linearization system 10 may still linearizes the DAC output signal. The purity of the output signal of the DAC linearization system 10 no longer relies on the performances of the DAC 12 and the ADC 18. The output signal of the DAC linearization system 10 may have a much higher purity level than an output signal of the solo DAC 12. With the low purity DAC and ADC, it is cost effective to set up the DAC linearization system 10 for superior linearity analog signals.

Section A (Method 1)

The initial digital input signal to the DAC 12 is given by:

$$C_{DAC}[n]=\text{round}(\alpha n \times 2^{N_{DAC}}) \quad (1)$$

where n=0, 1, 2 ... M−1, M is total data record length; an is the linear part of a ramp signal; the DAC output range is [0 $V_{RDAC}$] and has a resolution of $N_{DAC}$ bit.

Since the summing buffer structure 14 and the offset generator 16 will add additional gain and offset between the output of the DAC 12 and the input of the ADC 18, the offset and gain error of the DAC 12, the summing buffer structure 14, and the offset generator 15 are lumped together. This allows the convenience to assume the DAC 12 has no offset and gain error. Hence, both the first and second output signals of the DAC 12 are identical and may be viewed as below:

$$V_{OUT}(n)=\alpha n+F(n)+w(n) \quad (2)$$

where the first two terms on the right side represent the ideal DAC output, F(n) captures the low spatial frequency part of the DAC output errors, and w(n) captures the remaining errors after F(n).

Since F(n) is low frequency, any low frequency basis functions such as polynomials and sinusoids, here as an example, may be used. Herein, F(n) by a finite expansion of sine basis functions is given by:

$$F(n) = \sum_{j=1}^{H} a_j \cdot \sin(j\pi n) + e(n) \quad (3)$$

where only first H basis functions are included, and e(n) is the residue of nonlinearity that is not modeled by H basis functions.

For a first summing output signal of the summing buffer structure 14, a gain factor G and an offset signal Vos are applied to the first output signal of the DAC 12. For a second summing output signal of the summing buffer structure 14, only the gain factor G is applied. The gain factor G is small, only 0.5%-1% of the DAC output range. The first summing output signal and the second summing output signal of the summing buffer structure 14 are represented by eq.(4) and eq.(5).

$$V_{SUM(1)}(n)=G \cdot V_{OUT}(n)+V_{OS} \quad (4)$$

$$V_{SUM(2)}(n)=G \cdot V_{OUT} \quad (5)$$

The first summing output signal and the second summing output signal will serve as the two different inputs to the ADC 18. From the corresponding two ADC output signals, the ADC integral nonlinearity (INL)/differential nonlinearity (DNL) may be calculated.

The ADC transition level is defined as $T_k$, and the transition time $t_k$ is defined as the time at which the value of the analog ramp signal equals to $T_k$, and k=0, 1, ... $2^N-1$, where N is the resolution of the ADC 18. They are related by:

$$T_k=G \cdot V_{OUT}(t_k) \quad (6)$$

$t_k$ can be obtained by using the traditional histogram test. Assume $C_k$ is the histogram count for each ADC output signal, $t_k$ can be obtained by:

$$t_k = \frac{\sum_{i=1}^{k} C_i}{\sum_{i=1}^{2^N-2} C_i} \quad (7)$$

Then INL[k] of the ADC 18 can be estimated by:

$$INL[k] = (2^N - 2)t_k + \sum_{j=1}^{H} a_j \sin(j\pi t_k) - k \quad (8)$$

Since a nonlinear input stimulus is used to test ADC 18, which has the nonlinearity part of $$\sum_{j=1}^{H} a_j \sin(j\pi t_k),$$

if they can be estimated accurately, then the INL[k] of the ADC 18 can therefore be accurately estimated. From the first and second DAC output signals and the first and second ADC output signals, $T_k$ can be expressed as:

$$T_k=G \cdot V_{OUT}(t_k^1) \quad (9)$$

$$T_k=G \cdot V_{OUT}(t_k^2)+V_{OS} \quad (10)$$

where $t_k^1$ and $t_k^2$ are transition times obtained from two ADC output histogram counts, respectively. For the same ADC 18, the transition level is the same, by equating eq.(9) and eq.(10), eq.(11) can be obtained:

$$(2^N - 2)t_k^1 + \sum_{j=1}^{H} a_j \sin(j\pi t_k^1) = (2^N - 2)t_k^2 + \sum_{j=1}^{H} a_j \sin(j\pi t_k^2) - V_{OS} \quad (11)$$

Moving all known terms to the left and all unknown terms to the right, eq. (12) can be re-written as:

$$(2^N - 2) \cdot (t_k^1 - t_k^2) = \sum_{j=1}^{H} a_j [\sin(j\pi t_k^1) - \sin(j\pi t_k^2)] - V_{OS} \quad (12)$$

Since H is much smaller than $2^N$, the number of equations is much larger than the number of unknowns, Least Square can be used to estimate the unknowns $\alpha_j$ and $V_{OS}$, given by:

$$\{\hat{a}_1, \hat{a}_2, L, \hat{a}_H, \hat{V}_{OS}\} = \text{argmin} \quad (13)$$

$$\left\{ \sum_k \left( (2^N - 2) \cdot (t_k^1 - t_k^2) - \left[ \sum_{j=1}^{H} a_j [\sin(j\pi t_k^1) - \sin(j\pi t_k^2)] - V_{os} \right] \right)^2 \right\}$$

After the Least Square, the estimated ADC INL[k] is then given by:

$$INL[k] = (2^N - 2)t_k^1 + \sum_{j=1}^{H} \hat{a}_j \sin(j\pi t_k^1) - k \quad (14)$$

With the nonlinearity of the ADC 18 estimated, it will be possible to obtain estimation of the nonlinearity of the DAC 12. The first/second output signal of the DAC 12 may be viewed as two components. First, the ideal component of the first/second DAC output signal is due to the initial digital input signal $C_{DAC}[n]$ to the DAC 12. Then, another part is nonlinearity of the DAC $INL_{DAC}[C_{DAC}[n]]$, along with the noise of the DAC. Due to the random nature and small quantity, the noise is ignored in the following derivations. In addition, the first/second output signal of the summing buffer structure 14 based on the first/second output signal of the DAC 12 are also the input signals of the ADC 18, as given by $$[C_{DAC}[n] + INL_{DAC}[C_{DAC}[n]]] \cdot G + V_{OS} = C_{DAC1}[n] + INL_{ADC}[C_{ADC1}[n]] \quad (15)$$

$$[C_{DAC}[n] + INL_{DAC}[C_{DAC}[n]]] \cdot G = C_{DAC2}[n] + INL_{ADC}[C_{ADC2}[n]] \quad (16)$$

where n=0, 1, 2 ... M−1, M is total data record length. G is the gain, and $V_{OS}$ is the offset signal. $INL_{DAC}, INL_{ADC}$ are the INL of the DAC 12 and the ADC 18, respectively. $C_{ADC,1}, C_{ADC,2}$ are the first and second ADC output signals, respectively. In eq.(15) and eq. (16), the initial digital input signal $C_{DAC}[n]$ to the DAC 12, the first and second output signal $C_{ADC1}[n]$ and $C_{ADC2}[n]$, and the ADC INL are already known. The offset signal $V_{OS}$ has already been calculated by the Least Square in eq.(13). The gain G can be calculated as shown by:

$$\hat{G} = [C_{ADC1}[2^N] - C_{ADC1}[1]]/2^N \quad (17)$$

Once the gain G and the offset signal $V_{OS}$ are calculated, either eq.(4) or eq.(5) can be used to solve for the INL of the DAC 12 for the first/second output signal. This will lead to two supposedly the same solutions as in eq.(18) and eq.(19).

$$INL_{DAC1}[n] = [C_{ADC1}[n] + INL[C_{ADC1}[n]] - V_{OS}]/\hat{G} - n \quad (18)$$

$$INL_{DAC2}[n] = [C_{ADC2}[n] + INL[C_{ADC1}[n]]]/\hat{G} - n \quad (19)$$

But in reality, due to noise, the two solutions might be slightly different. To improve precision, the calculated INL of the DAC 12 may be found by averaging the two different INL calculations.

$$INL_{DAC}[n] = \frac{INL_{DAC1}[n] + INL_{DAC1}[n]}{2} \quad (20)$$

Once the INL of the DAC 12 is estimated, a corresponding correction signal may be provided by the error look-up table 22. The initial digital input signal $C_{DAC}[n]$ is then calibrated by the correction signal to provide a calibrated digital input signal to the DAC 12. The calibrated digital input signal ensures that the DAC 12 will generate an updated output signal with less nonlinearity and improved purity.

Section B (Method 2)

The first and second summing output signal of the summing buffer structure 14 based on the first and second DAC output signal of the DAC 12, respectively, are also the input signals of the ADC 18, as given by (same as eq.(15) and eq.(16)):

$$[C_{DAC}[n] + INL_{DAC}[C_{DAC}[n]]] \cdot G + V_{OS} = C_{DAC1}[n] + INL_{ADC}[C_{ADC1}[n]] \quad (21)$$

$$[C_{DAC}[n] + INL_{DAC}[C_{DAC}[n]]] \cdot G = C_{DAC2}[n] + INL_{ADC}[C_{ADC2}[n]] \quad (22)$$

where n=0, 1, 2 ... M−1, M is total data record length. G is the gain, and $V_{OS}$ is the offset supply. $INL_{DAC}, INL_{ADC}$ are the INL of the DAC 12 and the ADC 18, respectively. $C_{ADC,1}, C_{ADC,2}$ are the first and second ADC output signals, respectively. The initial digital input signal $C_{DAC}$ for both of the first and second DAC output signals are the same, given by:

$$C_{DAC}[n] = \text{round}(\alpha n \times 2^{N_{DAC}}) \quad (23)$$

where n=0, 1, 2 ... M−1, M is the total data record length; an is the linear part of a ramp signal; the DAC output range is $[0 \; V_{RDAC}]$ and has a resolution of $N_{DAC}$ bit. After the first and second ADC output signals are acquired, they are sorted according to the ADC code index: from 0 to $2^N-1$, where N is the ADC resolution. Then, at each code index (0 to $2^N-1$), both left and right sides of eq.(21) and (22) are averaged, given as:

$$(C_{DAC}[n_1] + INL_{DAC}[C_{DAC}[n_1]]) \cdot G|_{avg} = C_{DAC,1}[i] + INL_{ADC}[C_{ADC,1}[i]] \quad (24)$$

$$(C_{DAC}[n_2] + INL_{DAC}[C_{DAC}[n_2]]) \cdot G + V_{OS}|_{avg} = C_{DAC,2}[i] + INL_{ADC}[C_{ADC,2}[i]] \quad (25)$$

where i=0, 1, ... $2^N-1$, and since there are multiple hits per code, meaning that M is larger than $2^N$. For example, for $1^{st}$ sets of data from the first ADC output signal in eq.(24), if ADC code 1 ($C_{ADC,1}[1]$) has 9 hits: 2 from $C_{DAC}[7]$, 6 from $C_{DAC}[8]$, and 1 from $C_{DAC}[9]$, then eq.(24) is given by:

$$(2 \cdot C_{DAC}[7] + 6 \cdot C_{DAC}[8] + 1 \cdot C_{DAC}[9] + 2 \cdot INL_{DAC}[C_{DAC}[7]] + \quad (26)$$
$$6 \cdot INL_{DAC}[C_{DAC}[8]] + 1 \cdot INL_{DAC}[C_{DAC}[9]]) \cdot \frac{G}{9} =$$
$$C_{ADC,1}[1] + INL_{ADC}[C_{ADC,1}[1]]$$

Eq. (24) and (25) consist of a total of $2 \cdot 2^N$ equations, they are to be re-written into matrix form:

$$G \cdot (L_1 + H_1 \cdot INL_{DAC}) = C_{ADC} + INL_{ADC} \quad (27)$$

$$G \cdot (L_2 + H_2 \cdot INL_{DAC}) = V_{OS} + C_{ADC} + INL_{ADC} \quad (28)$$

The terms in eq.(27) and (28) are defined as follows, and j=1,2:

$$L_j = \begin{bmatrix} C_{DAC,j}(C_{ADC}[0])|_{avg} \\ C_{DAC,j}(C_{ADC}[1])|_{avg} \\ M \\ C_{DAC,j}(C_{ADC}[2^N-1])|_{avg} \end{bmatrix}_{2^N \times 1} \quad (29)$$

$$H_j = \begin{bmatrix} INL_{DAC}(C_{ADC}[0])|_{avg} \\ INL_{DAC}(C_{ADC}[1])|_{avg} \\ M \\ INL_{DAC}(C_{ADC}[2^N-1])|_{avg} \end{bmatrix}_{2^N \times 2^{N_{DAC}}} \quad (30)$$

Depending on the different inputs to the ADC 18, the averaged values: $C_{DAC,j}(C_{ADC}[i])|_{avg}$ and $INL_{DAC}(C_{ADC}[i])|_{avg}$ will be different for j=1 and 2. And INL of the DAC 12 and the ADC 18 may also be re-written as the matrix form:

$$INL_{ADC} = \begin{bmatrix} INL_{ADC}(0) \\ INL_{ADC}(1) \\ M \\ INL_{ADC}(2^N-1) \end{bmatrix} \quad (31)$$

$$INL_{DAC} = \begin{bmatrix} INL_{DAC}(0) \\ INL_{DAC}(1) \\ M \\ INL_{DAC}(2^{N_{DAC}}-1) \end{bmatrix} \quad (28)$$

Since the right side of eq.(27) and eq.(28) are the same, with the same ADC 18 used, by subtracting eq.(28) from eq.(27), and putting all the known parameters to the right, eq.(33) is obtained.

$$[H_1 - H_2, -1]_{2^N \times (2^{N_{DAC}}+1)} \cdot \begin{bmatrix} INL_{DAC} \\ V_{OS}/G \end{bmatrix}_{(2^{N_{DAC}}+1) \times 1} = L_2 - L_1 |_{2^N \times 1} \quad (33)$$

On the right side of eq.(33), the differences of two data set averaged DAC codes are shown, while on the left side of eq.(33), all the unknowns that need to be estimated are shown: the INL of the DAC 12 and the offset supply $V_{OS}$ over the gain G. It can be viewed as:
where $$aX = b \text{ where} \quad (34)$$

$$a = [H_1 - H_2, -1], X = \begin{bmatrix} INL_{DAC} \\ V_{OS}/G \end{bmatrix} \text{ and } b = L_2 - L_1$$

The Least Square method can be used to estimate the unknowns:

$$\hat{X} = (a^T a)^{-1}(a^T b) \quad (35)$$

In order for the Least Square to operate, the estimated resolution of the DAC needs to be lower than the ADC resolution, so that the unknowns are fewer than the number of equations for the estimation. For example, if both the DAC 12 and the ADC 18 are used, utilizing eq.(35) may obtain the estimated DAC INL up to 11 bits. For the rest of the least significant bits (LSBs) of the DAC 12, additional steps are taken if the DAC 12 has higher resolution than the ADC 18.

After $N_{DAC}$ most significant bits (MSBs) are estimated, based on eq.(27) and (28), eq.(36) and (37) can be constructed, which are the two estimated summing output signals up to $N_{DAC}$ bit resolution, where the LSBs are ignored.

$$G \cdot (L_1 + H_1 \cdot INL_{DAC}) = C_{ADC} + INL_{ADC} \quad (36)$$

$$G \cdot (L_2 + H_2 \cdot INL_{DAC}) - V_{OS} = C_{ADC} + INL_{ADC} \quad (37)$$

Assuming the rest of the un-estimated LSB has $N_{DSLB}$ bits, similar matrix representation of these bits can be constructed as well, and are added in eq.(38) and (39):

$$G \cdot (L_1 + H_1 \cdot INL_{DAC} + L_{1,LSB} + H_{1,LSB} \cdot INL_{DLSB}) = C_{ADC} + INL_{ADC} \quad (38)$$

$$G \cdot (L_2 + H_2 \cdot INL_{DAC} + L_{2,LSB} + H_{2,LSB} \cdot INL_{DLSB}) + V_{OS} = C_{ADC} + INL_{ADC} \quad (39)$$

Where $$L_j = \begin{bmatrix} C_{DAC,j}(C_{ADC}[0])|_{avg} \\ C_{DAC,j}(C_{ADC}[1])|_{avg} \\ M \\ C_{DAC,j}(C_{ADC}[2^N-1])|_{avg} \end{bmatrix}_{2^N \times 1} \quad (40)$$

$$H_j = \begin{bmatrix} INL_{DLSB}(C_{ADC}[0])|_{avg} \\ INL_{DLSB}(C_{ADC}[1])|_{avg} \\ M \\ INL_{DLSB}(C_{ADC}[2^N-1])|_{avg} \end{bmatrix}_{2^N \times 2^{N_{DLSB}}} \quad (41)$$

This is similar to eq.(27) and (28), but the averages in eq.(40) and (41) are quantized only to $N_{DLSB}$ bits, not $N_{DAC}$ bits anymore.

By equating eq.(38) and (39), eq.(42) is obtained:

$$[H_{1,LSB} - H_{2,LSB}, -1] \cdot \begin{bmatrix} INL_{DLSB} \\ V_{OS}/G \end{bmatrix} = \quad (42)$$

$$L_2 + H_2 \cdot INL_{DAC} - L_1 - H_1 \cdot INL_{DAC} + L_{2,LSB} - L_{1,LSB}$$

This is similar to eq.(33) and the Least Square can be used to estimate $INL_{DSLB}$. After both $INL_{DAC}$ and $INL_{DLSB}$ are estimated, the full code INL of the DAC 12 can be constructed. The LSB part of the code $INL_{DLSB}$ is added at each $INL_{DAC}$ code, so that each $INL_{DAC}$ code now becomes a total of $2^{N_{LSB}}$ INL codes, thus the full code of $N_{DAC} + N_{LSB}$ bits INL can be estimated.

In fact, since the $N_{DLSB}$ bits are usually much fewer than $N_{DAC}$, the number of equations used in eq.(38), (39) and (42) can be much fewer than $2^N$ in order for the Least Square to operate and estimate. For example, if a 12 bit ADC is used, and 4 bits LSB is left to estimate, with a total of 16 $INL_{LSB}$s, there is no need to use $2^{12}$ number of equations, 100 equations is sufficient in eq.(42). This will make the Least Square operate much faster in eq.(42) without losing accuracy. After the DAC full code INL is estimated, using either eq.(38) or (39) will obtain the estimation of ADC INL, given by:

$$INL_{ADC} = \hat{G} \cdot (L_1 + H_1 \cdot INL_{DAC} + L_{1,LSB} + H_{1,LSB} \cdot INL_{DLSB}) - C_{ADC} \quad (43)$$

where $\hat{G} = [C_{ADC,1}[2^N] - C_{ADC,1}[1]]/2^N$.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
    a digital-to-analog converter (DAC) configured to sequentially provide a first DAC output signal and a second DAC output signal based on a digital input signal, wherein both the first DAC output signal and the second DAC output signal include DAC integral non-linearity (INL) from the DAC;
    a summing buffer structure configured to sequentially provide a first summing output signal and a second summing output signal, wherein:
        the first summing output signal is based on the first DAC output signal and a first offset signal, and the second summing output signal is based on the second DAC output signal and a second offset signal; and
        the first offset signal is different from the second offset signal;
    an analog-to-digital converter (ADC) configured to sequentially provide a first ADC output signal based on the first summing output signal and a second ADC output signal based on the second summing output signal;
    a calculation system configured to calculate the DAC INL based on the first ADC output signal and the second ADC output signal;
    an error look-up table configured to provide a correction signal mapping to the calculated DAC INL; and
    an adder configured to provide a calibrated digital input signal to the DAC by calibrating the digital input signal with the correction signal, wherein the calibrated digital input signal ensures the DAC to generate an updated output signal that includes less DAC INL than the first DAC output signal and the second DAC output signal.

2. The apparatus of claim 1 wherein the calculation system includes at least one of a group consisting of a microcontroller, application specific integrated circuit (ASIC), and a computer.

3. The apparatus of claim 1 wherein the error look-up table and the calculation system are embedded in a same printed circuit board (PCB) as the DAC and the ADC.

4. The apparatus of claim 3 wherein the error look-up table and the calculation system are integrated in a same microcontroller, which is embedded in the same PCB as the DAC and the ADC.

5. The apparatus of claim 1 wherein the DAC, the summing buffer structure, the ADC, the calculation system, the error look-up table, and the adder are integrated in a chip.

6. The apparatus of claim 1 wherein the error look-up table and the calculation system are off a PCB board, in which the DAC and the ADC are embedded.

7. The apparatus of claim 6 wherein the error look-up table and the calculation system are implemented in a same computer.

8. The apparatus of claim 1 wherein the first DAC output signal and the second DAC output signal are identical.

9. The apparatus of claim 8 wherein the first offset signal is zero and the second offset signal has an offset voltage which is 0.5%-1% output range of the first DAC output signal.

10. The apparatus of claim 1 further includes an offset generator configured to provide either the first offset signal or the second offset signal to the summing buffer structure.

11. The apparatus of claim 10 wherein the calculation system is configured to provide a control signal to the offset generator to selectively provide the first offset signal and the second offset signal to the summing buffer structure.

12. The apparatus of claim 10 wherein the offset generator comprises a three-terminal switch having a first switch terminal coupled to the summing buffer structure, a second switch terminal coupled to ground, and a third switch terminal coupled to an offset supply, wherein:
    when the first switch terminal is coupled to the second switch terminal, the offset generator provides the first offset signal to the summing buffer structure; and
    when the first switch terminal is coupled to the third switch terminal, the offset generator provides the second offset signal to the summing buffer structure.

13. The apparatus of claim 12 wherein the calculation system is configured to provide a control signal to the offset generator to selectively connect the first switch terminal with the second switch terminal and the first switch terminal with the third switch terminal.

14. The apparatus of claim 1 wherein the summing buffer structure comprises a summing unit and an operational amplifier (op-amp) buffer coupled to the summing unit, wherein:
    the summing unit is configured to sum the first DAC output signal and the first offset signal and the op-amp buffer is configured to provide the first summing output signal; or
    the summing unit is configured to sum the second DAC output signal and the second offset signal and the op-amp buffer is configured to provide the second summing output signal.

15. The apparatus of claim 1 wherein the DAC and the ADC have a same resolution.

16. The apparatus of claim 1 wherein the DAC has a lower resolution than the ADC.

17. The apparatus of claim 1 wherein the DAC has a higher resolution than the ADC.

18. A method comprising:
    sequentially generating a first DAC output signal and a second DAC output signal by a DAC based on a digital input signal, wherein both the first DAC output signal and the second DAC output signal include DAC INL from the DAC;
    sequentially generating a first summing output signal and a second summing output signal by a summing buffer structure, wherein:
        the first summing output signal is generated based on the first DAC output signal and a first offset signal;
        the second summing output signal is generated based on the second DAC output signal and a second offset signal; and
        the first offset signal is different from the second offset signal;
    sequentially generating a first ADC output signal and a second ADC output signal by an ADC, wherein the first ADC output signal is generated based on the first summing output signal, and the second ADC output signal is generated based on the second summing output signal;
    calculating the DAC INL by a calculation system, wherein the DAC INL is calculated based on the first ADC output signal and the second ADC output signal;
    providing a correction signal by an error look-up table, wherein the correction signal is mapping to the calculated DAC INL; and
    calibrating the digital input signal with the correction signal to provide a calibrated digital input signal to the DAC.

19. The method of claim 18 further comprising generating an updated DAC output signal by the DAC based on the calibrated digital input signal, wherein the updated DAC output signal corrects at least a portion of the DAC INL included in the DAC and has a higher purity level than the first DAC output signal and the second DAC output signal.

20. The method of claim 18 further comprising selectively providing the first offset signal and the second offset signal to the summing buffer structure by an offset generator.

21. The method of claim 20 wherein selectively providing the first offset signal and the second offset signal to the summing buffer structure is controlled by a control signal generated by the calculation system to the offset generator.

22. The method of claim 18 further comprising storing the digital input signal, the first ADC output signal, and the second ADC output signal in the calculation system before calculating the DAC INL from the DAC.

23. The method of claim 18 wherein calculating the DAC INL is implemented by a first portion of the calculation system, which is a microcontroller embedded in a same PCB as the DAC and the ADC.

24. The method of claim 18 wherein calculating the DAC INL is implemented by a first portion of the control system, which is a computer off a PCB that the DAC and the ADC are embedded in.

* * * * *

UNITED STATES PATENT AND TRADEMARK OFFICE
CERTIFICATE OF CORRECTION

PATENT NO.         : 10,218,371 B1
APPLICATION NO.    : 15/909233
DATED              : February 26, 2019
INVENTOR(S)        : Yuming Zhuang et al.

Page 1 of 1

It is certified that error appears in the above-identified patent and that said Letters Patent is hereby corrected as shown below:

In the Specification

Column 9, Line 33, replace "length; an" with --length; $\alpha$n--.

Column 10, equation 5, replace "$V_{SUM(2)}(n) = G \cdot V_{OUT}$" with --$V_{SUM(2)}(n) = G \cdot V_{OUT}(n)$--.

Column 11, equation 15, replace "= $C_{DAC1}[n]$ +" with --= $C_{ADC1}[n]$ +--.

Column 11, equation 16, replace "= $C_{DAC2}[n]$ +" with --= $C_{ADC2}[n]$ +--.

Column 12, equation 21, replace "= $C_{DAC1}[n]$ +" with --= $C_{ADC1}[n]$ +--.

Column 12, equation 22, replace "= $C_{DAC2}[n]$ +" with --= $C_{ADC2}[n]$ +--.

Column 12, Line 34, replace "an is the linear part" with --$\alpha$n is the linear part--.

Column 12, Line 43, equation 24, replace "= $C_{DAC,1}[i]$ +" with --= $C_{ADC,1}[i]$ +--.

Column 12, Line 45, equation 25, replace "$C_{DAC,2}[i]$ +" with --$C_{ADC,2}[i]$ +--.

Column 12, Line 55, equation 26, replace "$6 \cdot INL_{DAC}[C_{DAc}[8]]$" with --$6 \cdot INL_{DAC}[C_{DAC}[8]]$--.

Column 13, in equations 29, 30, and 31, replace the "M" with --□--.

Column 13, Line 25, replace equation number "(28)" with --(32)--.

Column 13, equation 32, replace the "M" with --□--.

Column 14, equations 40 and 41, replace the "M" with --□--.

<p style="text-align:center">Signed and Sealed this<br/>Sixteenth Day of April, 2019</p>

<p style="text-align:center">Andrei Iancu<br/><em>Director of the United States Patent and Trademark Office</em></p>